US010606073B1

(12) United States Patent
Black et al.

(10) Patent No.: US 10,606,073 B1
(45) Date of Patent: Mar. 31, 2020

(54) SINGLE LENS HEAD-UP DISPLAY APPARATUS

(71) Applicant: Lockheed Martin Corporation, Bethesda, MD (US)

(72) Inventors: Jason M. Black, Orlando, FL (US); Gregory A. Harrison, Oviedo, FL (US); Julio Corsi, Orlando, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 15/800,969

(22) Filed: Nov. 1, 2017

(51) Int. Cl.
| G02B 27/01 | (2006.01) |
| G02B 27/00 | (2006.01) |
| B64D 43/00 | (2006.01) |
| G09B 9/30 | (2006.01) |
| G06F 17/50 | (2006.01) |

(52) U.S. Cl.
CPC ............ *G02B 27/01* (2013.01); *B64D 43/00* (2013.01); *G02B 27/0012* (2013.01); *G02B 27/0101* (2013.01); *G02B 27/0149* (2013.01); *G09B 9/302* (2013.01); *B60R 2300/205* (2013.01); *G02B 2027/013* (2013.01); *G02B 2027/0118* (2013.01); *G02B 2027/0159* (2013.01); *G06F 17/50* (2013.01)

(58) Field of Classification Search
CPC ............... G02B 27/01; G02B 27/0101; G02B 27/0149; G02B 2027/0118; G02B 2027/0159; G02B 2027/013; G02B 27/0012; G09B 9/302; G06F 17/50; B60R 2300/205
See application file for complete search history.

(56) References Cited

U.S. PATENT DOCUMENTS 3,885,095 A * 5/1975 Wolfson ................. G02B 27/01
                                                            348/115
3,909,523 A * 9/1975 Bartucci ................ G02B 13/16
                                                            348/781

(Continued)

FOREIGN PATENT DOCUMENTS

EP  3109688 A1  12/2016
GB  2451895 A  *  2/2009  ............ G03B 21/60

OTHER PUBLICATIONS

Barrett, B., "A HUD With Built-In Navigation Makes for a KITT-Worthy Windshield," Gizmodo, Available online at: <<https://gizmodo.com/5559170/a-hud-with-built-in-navigation-makes-for-a-kitt-worthy-windshield>>, Jun. 9, 2010, 3 pages.

(Continued)

*Primary Examiner* — Cara E Rakowski
*Assistant Examiner* — Magda Cruz
(74) *Attorney, Agent, or Firm* — Withrow & Terranova, PLLC

(57) ABSTRACT

A head-up display (HUD) apparatus is provided. The HUD apparatus includes a display holder configured to hold a single planar multiple-pixel display. The HUD apparatus also includes a single reflective and transmissive lens that is configured to reflect an image from the planar multiple-pixel display toward a predetermined location of a user. The reflective and transmissive lens is further configured to at least partially collimate light from the planar multiple-pixel display to focus the image at a distance in front of the reflective and transmissive lens for each eye of two eyes of the user.

10 Claims, 14 Drawing Sheets

(56) References Cited

U.S. PATENT DOCUMENTS

| | | | |
|---|---|---|---|
| 5,331,149 A * | 7/1994 | Spitzer | A61B 3/113 |
| | | | 250/221 |
| 5,642,227 A | 6/1997 | Rallison | |
| 5,907,416 A | 5/1999 | Hegg et al. | |
| 6,236,511 B1 | 5/2001 | Brown | |
| 6,611,384 B1 * | 8/2003 | Biverot | G02B 27/01 |
| | | | 345/7 |
| 6,989,934 B2 * | 1/2006 | Aoki | B60K 35/00 |
| | | | 345/7 |
| 7,532,175 B2 * | 5/2009 | Aoki | G02B 27/0101 |
| | | | 345/7 |
| 8,749,890 B1 | 6/2014 | Wood et al. | |
| 8,781,794 B2 | 7/2014 | Harrison et al. | |
| 8,854,281 B2 | 10/2014 | Ho et al. | |
| 9,720,260 B2 | 8/2017 | Calilung et al. | |
| 2001/0043163 A1 * | 11/2001 | Waldern | G02B 5/1885 |
| | | | 345/7 |
| 2002/0166273 A1 * | 11/2002 | Nakamura | G02B 27/0101 |
| | | | 40/593 |
| 2007/0009862 A1 * | 1/2007 | Quinn | G09B 9/00 |
| | | | 434/38 |
| 2015/0029410 A1 | 1/2015 | Laycock et al. | |
| 2018/0066995 A1 * | 3/2018 | Bibby | G03F 7/70583 |
| 2018/0149868 A1 * | 5/2018 | Nakayama | B60K 37/04 |

OTHER PUBLICATIONS

Doucette, R. A., "Design Decisions for a Head-Up Display," IEEE Spectrum, vol. 13, No. 8, Aug. 1976, pp. 29-32.

Garmin, "Garmin® HUD Owner's Manual," Aug. 2013, 5 pages.

Pedrotti, F. L., et al., "Introduction to Optics (2nd Edition)," Prentice-Hall, International, Inc., 1993, 619 pages.

Shin, S. C., et al., "Portable virtual display system design with a wide eye motion box for a motor vehicle," Proceedings of SPIE—The International Society for Optical Engineering, vol. 8167, Optical Design and Engineering IV, Sep. 21, 2011, 7 pages.

Qin, Z., et al., "Maximal Acceptable Ghost Images for Designing a Legible Windshield-Type Vehicle Head-Up Display," IEEE Photonics Journal, vol. 9, No. 6, Dec. 2017, pp. 1-12.

Rockwell Collins, "Front-Projected Dome Display Systems," Brochure copyrighted 2009, Rockwell Collins, Inc., Accessed Oct. 9, 2017, 2 pages.

Wanninger, M., "LED light sources for head-up displays," Proceedings of SPIE—The International Society for Optical Engineering, vol. 5663, Photonics in the Automobile, Feb. 16, 2005, 6 pages.

\* cited by examiner

SINGLE LENS HEAD-UP DISPLAY APPARATUS

TECHNICAL FIELD

The embodiments relate generally to a head-up display apparatus, and in particular to a single lens head-up display apparatus for use with two-eye viewing.

BACKGROUND

A head-up display (HUD) apparatus provides imagery for a viewer, typically a simulator trainee or an operator of a vehicle, such as an airplane, a ground vehicle, a boat, or other moving vehicle, with imagery that includes certain information that may be useful in the context of the scene perceived by the viewer. For example, in the context of a car, a HUD apparatus may display the current speed of the vehicle and the current speed limit of the road on which the vehicle is located.

Domed simulators are often used to train pilots. Typically the HUD imagery is provided via a rear projector that displays the imagery on the dome for viewing by the trainee inside the dome. One problem with this approach is that the imagery can be seen even when not looking through the HUD apparatus, which generates negative training in the sense that the trainee does not become conditioned to looking through the HUD apparatus to see the HUD imagery.

Actual HUD apparatuses used in an aircraft are prohibitively expensive for use in a simulator. Also, an actual HUD apparatus focuses the HUD imagery at infinity, which would be undesirable in a simulator, and expensive modifications would be required to modify the HUD apparatus for use in a domed simulator.

In a domed simulator it would be preferable to focus the HUD imagery on the dome to reduce eyestrain of the trainee who would otherwise need to continually refocus her eyes as she alternates between the out-the-window scene which is focused on the dome and the HUD imagery focused at infinity.

SUMMARY

The embodiments relate to a head-up display (HUD) apparatus that has a single planar multiple-pixel display and a single lens that allows two-eye viewing of HUD imagery through the single lens. In one embodiment, the single lens focuses the HUD imagery on the interior spherical surface of a domed simulator. The embodiments also include a method for generating a single lens for use in a HUD apparatus for two-eye viewing of HUD imagery.

Among other advantages, the embodiments facilitate a relatively low-cost HUD apparatus that is a true HUD apparatus which permits two-eye viewing of HUD imagery at a focal distance in front of the HUD apparatus, and has very few parts.

In one embodiment a HUD apparatus is provided. The HUD apparatus includes a display holder configured to hold a single planar multiple-pixel display. The HUD apparatus also includes a single reflective and transmissive lens that is configured to reflect an image from the planar multiple-pixel display toward a predetermined location of a user. The single reflective and transmissive lens is further configured to at least partially collimate light from the planar multiple-pixel display to focus the image at a distance in front of the single reflective and transmissive lens for each eye of two eyes of the user.

In another embodiment a method for generating a lens is provided. A plurality of display objects of a planar multiple-pixel display is represented. Each display object corresponds to a different area of the planar multiple-pixel display that is configured to emit an image portion of an image. A surface of the lens is represented via a plurality of points that make up a point cloud. Each point has a unique X, Y and Z coordinate. The points are grouped into particular oxels, each oxel overlapping other oxels such that each point may be grouped into one or more oxels. A correspondence is generated between each display object and an oxel. For each eye point location of a plurality of different eye point locations, the point cloud is iteratively processed to adjust the X, Y and Z coordinates of the points by, for each respective oxel: determining an ideal geometry of the respective oxel for reflecting light generated from the display object with which the respective oxel corresponds toward a predetermined location of an eye to cause the light to be focused at a particular location from the eye; and adjusting the X, Y and Z coordinates of the points that make up the respective oxel based on the ideal geometry of the oxel for reflecting light and on the ideal geometry of overlapping oxels that overlap the respective oxel. This process is repeated until a predetermined criterion, such as particular error function, is met.

In another embodiment a domed simulator is provided. The domed simulator includes a simulated cockpit, and a head-up display apparatus coupled to the simulated cockpit. The head-up display apparatus includes a display holder configured to hold a single planar multiple-pixel display, and a single reflective and transmissive lens configured to reflect an image from the planar multiple-pixel display toward a predetermined location of a user, the single reflective and transmissive lens further configured to at least partially collimate light from the planar multiple-pixel display to focus the image on the dome.

In another embodiment an airplane is provided. The airplane includes a cockpit and a head-up display apparatus coupled to the cockpit. The head-up display apparatus includes a display holder configured to hold a single planar multiple-pixel display, and a single reflective and transmissive lens configured to reflect an image from the planar multiple-pixel display toward a predetermined location of a user, the single reflective and transmissive lens further configured to at least partially collimate light from the planar multiple-pixel display to focus the image at infinity.

Those skilled in the art will appreciate the scope of the disclosure and realize additional aspects thereof after reading the following detailed description of the embodiments in association with the accompanying drawing figures.

BRIEF DESCRIPTION OF THE DRAWINGS

The accompanying drawing figures incorporated in and forming a part of this specification illustrate several aspects of the disclosure and, together with the description, serve to explain the principles of the disclosure.

DETAILED DESCRIPTION

Figure 1:
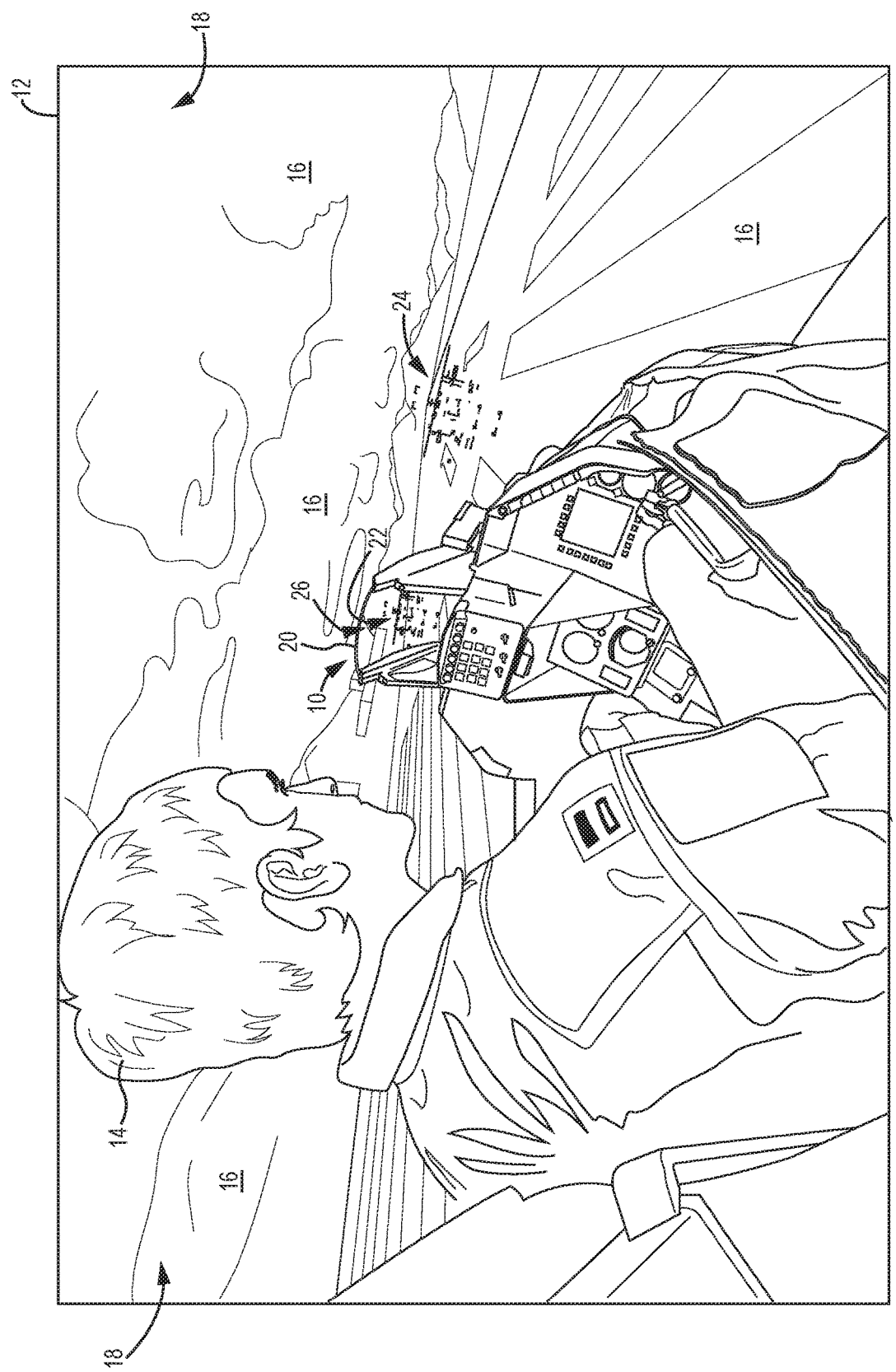
FIG. 1 is a perspective view of a head-up display (HUD) apparatus in an interior of a domed simulator according to one embodiment.

The embodiments set forth below represent the information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Any flowcharts discussed herein are necessarily discussed in some sequence for purposes of illustration, but unless otherwise explicitly indicated, the embodiments are not limited to any particular sequence of steps. The use herein of ordinals in conjunction with an element is solely for distinguishing what might otherwise be similar or identical labels, such as "first message" and "second message," and does not imply a priority, a type, an importance, or other attribute, unless otherwise stated herein. The term "about" used herein in conjunction with a numeric value means any value that is within a range of ten percent greater than or ten percent less than the numeric value.

As used herein and in the claims, the articles "a" and "an" in reference to an element refers to "one or more" of the element unless otherwise explicitly specified.

Domed simulators are often used to train pilots. Typically head-up display (HUD) imagery is provided via a rear projector that displays the imagery on the dome for viewing by the trainee inside the dome. One problem with this approach is that the imagery can be seen even when not looking through the HUD apparatus, which generates negative training in the sense that the trainee does not become conditioned to look through the HUD apparatus to see the HUD imagery.

Actual HUD apparatuses used in an aircraft are prohibitively expensive for use in a simulator. Also, an actual HUD apparatus focuses the HUD imagery at infinity, which would be undesirable in a simulator. In a domed simulator it would be preferable to focus the HUD imagery on the dome to reduce eyestrain of the trainee who would otherwise need to continually refocus her eyes as she alternates between the out-the-window scene which is focused on the dome and the HUD imagery focused at infinity.

The embodiments relate to a head-up display (HUD) apparatus that has a single planar multiple-pixel display and a single lens that allows two-eye viewing of HUD imagery through the single lens. In one embodiment, the single lens focuses the HUD imagery on the interior spherical surface of a domed simulator. The embodiments also include a method for generating a single lens for use in a HUD apparatus for two-eye viewing of HUD imagery.

Among other advantages, the embodiments facilitate a relatively low-cost HUD apparatus that is a true HUD apparatus which permits two-eye viewing of HUD imagery at a focal distance in front of the HUD apparatus, and has very few parts.

FIG. 1 is a perspective view of a HUD apparatus 10 in an interior of a domed simulator 12 according to one embodiment. A trainee 14 views out-the-window (OTW) imagery 16 on an interior surface of a dome 18 of the domed simulator 12. The HUD apparatus 10 includes a single reflective and transmissive lens 20 which focuses HUD imagery 22 generated by a planar multiple-pixel display (not illustrated) as virtual imagery 24 on the interior surface of the dome 18. While for purposes of illustration the HUD imagery 22 is shown focused on the lens 20, this is merely to depict that the HUD imagery 22 strikes the lens 20, but the HUD imagery 22 is not seen at the lens 20, rather, the HUD imagery 22 is seen by the trainee 14 as the virtual imagery 24. In particular, the light from the planar multiple-pixel display that forms the virtual imagery 24 seen by the trainee's eyes is partially collimated by the single lens 20 such that to the eyes of the trainee 14, the virtual imagery 24 is focused on the interior surface of the dome 18.

The lens 20 has both reflective and transmissive characteristics. A concave interior surface 26 of the lens 20 is configured to reflect an image from the planar multiple-pixel display toward a predetermined location of the trainee 14. The lens 20 is further configured to at least partially collimate light from the planar multiple-pixel display to focus the HUD imagery 22 at a distance in front of the lens 20 for each eye of the two eyes of the trainee 14 to generate the virtual imagery 24. The trainee 14 not only sees the virtual imagery 24 through the lens 20, but also that portion of the OTW imagery 16 that is framed by the lens 20. Both the OTW imagery 16 and the virtual imagery 24 are focused on the interior surface of the dome 18.

Figure 2:
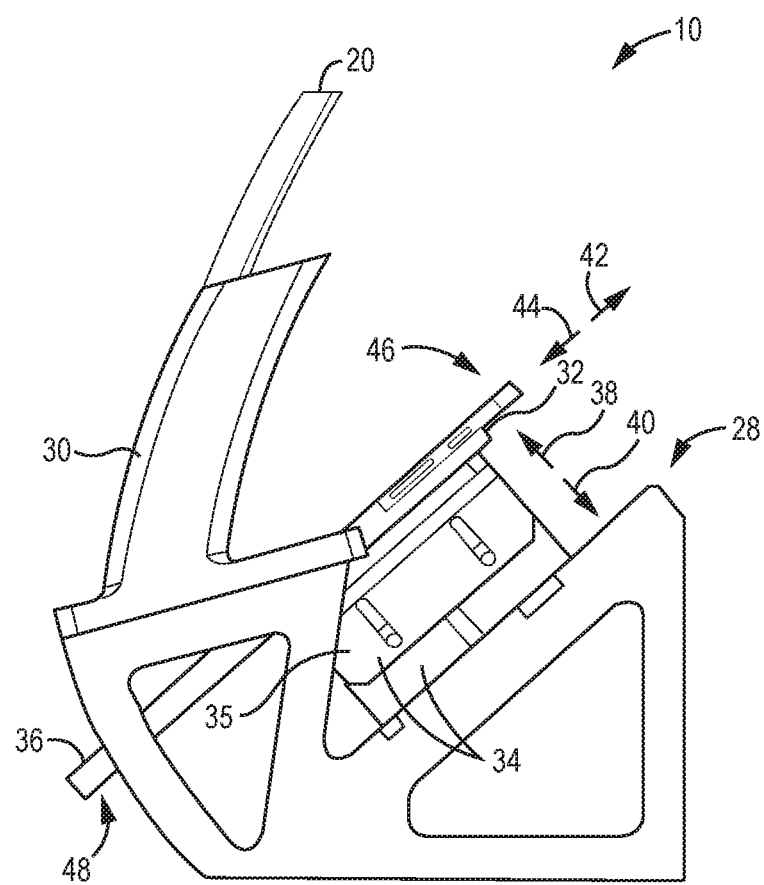
FIG. 2 is a side view of the HUD apparatus according to one embodiment.

FIG. 2 is a side view of the HUD apparatus 10 according to one embodiment. The HUD apparatus 10 includes a frame 28. The frame 28 includes a lens holder 30, a display holder 32, and a bracket 34. In some embodiments the lens holder 30 and a portion 35 of the bracket 34 may be separate components or may be a single, integrated component. The lens holder 30 holds the single reflective and transmissive lens 20 (sometimes referred to herein as "the lens 20" for brevity). The display holder 32 holds a single planar multiple-pixel display 36 (sometimes referred to herein as "the display 36" for brevity). The frame 28 may be configured to be coupled to a particular cockpit in a simulator, or an airplane. The display 36 may comprise any display technology that comprises a plurality of display objects, such as, by way of non-limiting example, organic light-emitting diode (OLED), liquid crystal display (LCD), or light-emitting diode (LED) display objects. Typically the display objects are arranged in a grid comprising a plurality of rows and columns of display objects. In some embodiments, the display 36 may comprise a smartphone or computing tablet. In other embodiments the display 36 may comprise a display having a particular size and a particular resolution for a particular design criterion of the HUD apparatus 10.

The bracket 34 may be an adjustable bracket 34 that allows adjustment of the display 36 in directions 38 and 40 to bring the display 36 closer to or farther from the lens 20. The bracket 34 may also allow adjustment of the display 36 in directions 42 and 44. The bracket 34 may also allow the display 36 to be pivoted with respect to the lens 20 so that either end 46 or end 48 of the display 36 can be moved closer or farther from the lens 20 along the directions 38 and 40 independently of one another. This allows the plane in which the display 36 lies to be varied with respect to the lens 20. The bracket 34 allows adjustment of the location of the virtual imagery 24 and focusing of the virtual imagery 24.

As will be discussed below, the lens 20 is designed and manufactured based on one or more predetermined locations of two eyes within an eye-box volume to partially or completely collimate the light produced by the display 36 such that the HUD imagery 22 generated by the display 36 is focused at a particular location in front of the HUD apparatus 10, such as on a dome of a simulator, or at infinity if used in an actual aircraft.

Figure 3:
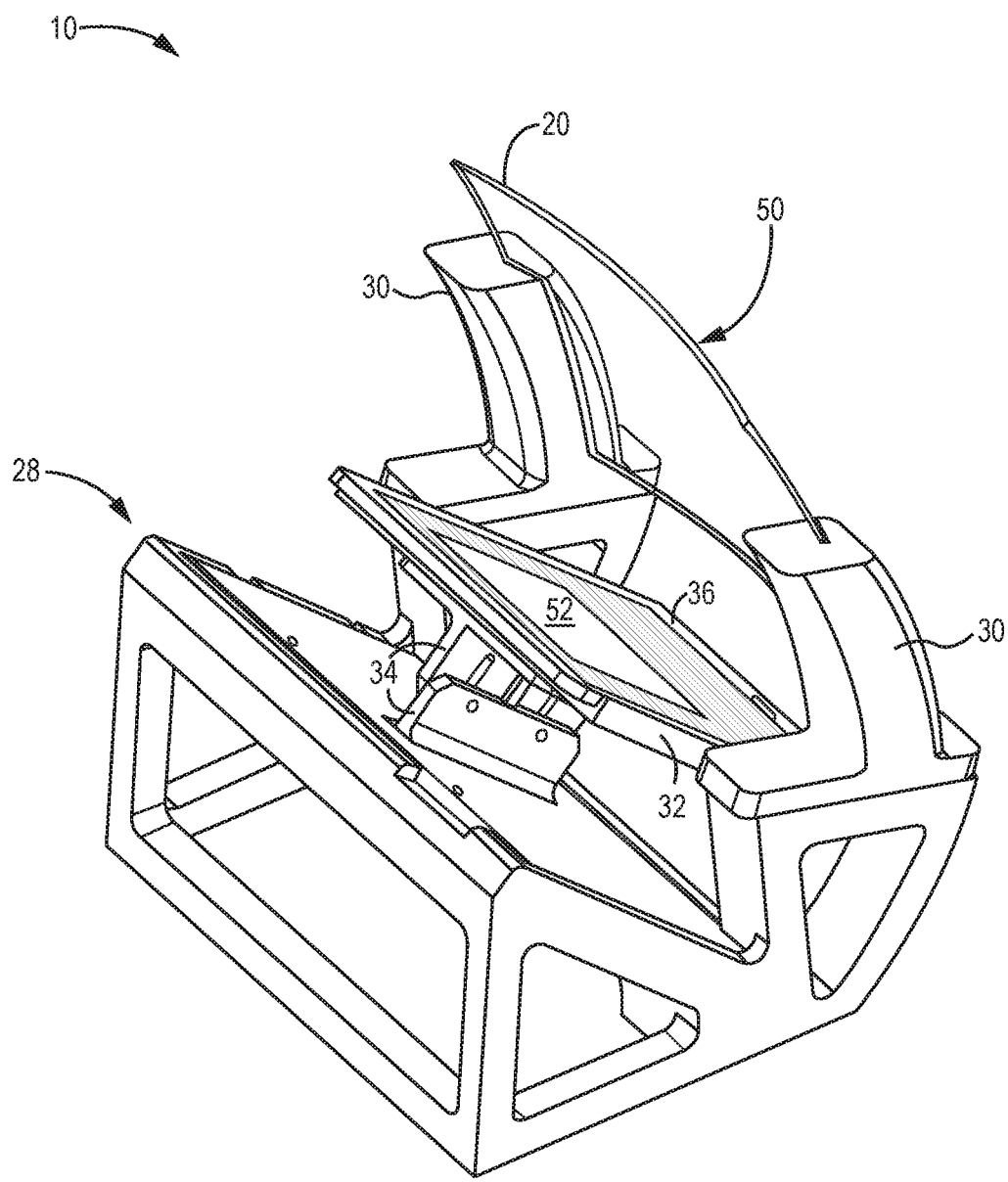
FIG. 3 is a rear perspective view of the HUD apparatus according to one embodiment.

FIG. 3 is a rear perspective view of the HUD apparatus 10 according to one embodiment. In some embodiments, the lens 20 has an anti-reflective coating 50 on the concave exterior surface of the lens 20. There may also be a partially reflective coating applied to the interior surface of the lens 20. The partially reflective coating may be, for example, 50% reflective. In this example, an actual HUD image display area 52 is a subset of the overall pixel area of the display 36. Thus, in this example, only the HUD image display area 52 is mapped to the lens 20, and not the entire area of the display 36.

Figure 4:
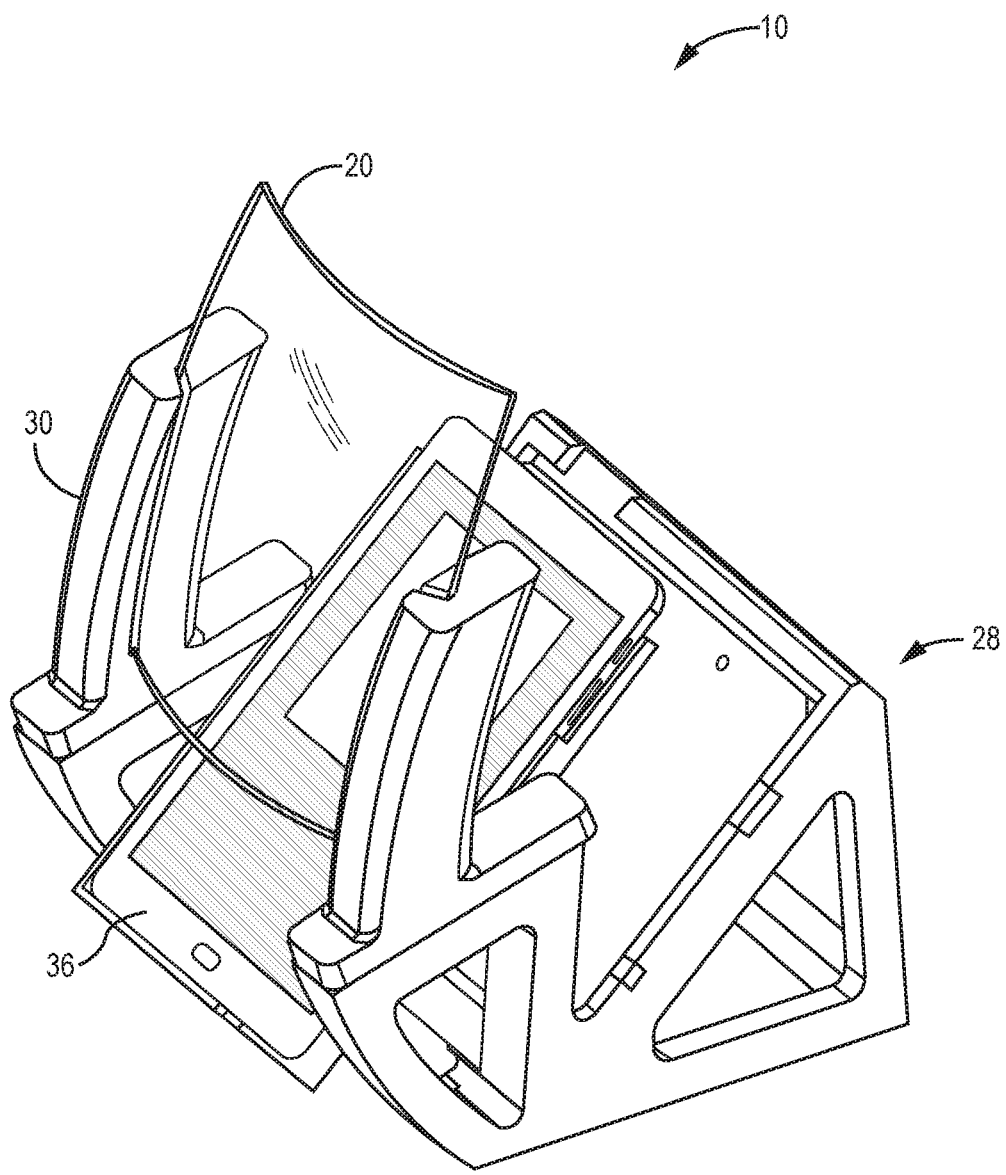
FIG. 4 is a front perspective view of the HUD apparatus according to one embodiment.

FIG. 4 is a front perspective view of the HUD apparatus 10 according to one embodiment. Note that in this embodiment the interior surface of the lens 20 is not equidistant from the display 36. For example, lower portions (when oriented in a state of operation) of the lens 20 are closer to the display 36 than upper portions of the lens 20. One problem with this is that a different amount of optical power is needed by the reflective surface areas at the bottom of the lens 20 to collimate the light generated by the display objects of the display 36 than the reflective surface areas of the lens 20 at the top of the lens 20. Thus, the radii of curvature of the reflective surface areas at the bottom of the lens 20 are different than the radii of curvature of the reflective surface areas at the top of the lens 20. Conventional optical refractive and reflective lenses have a single radius of curvature. In contrast, as will be discussed below in greater detail, the lens 20 comprises thousands or millions of radii of curvature to properly collimate light from the display 36 towards the eyes of the trainee 14.

Figure 5:
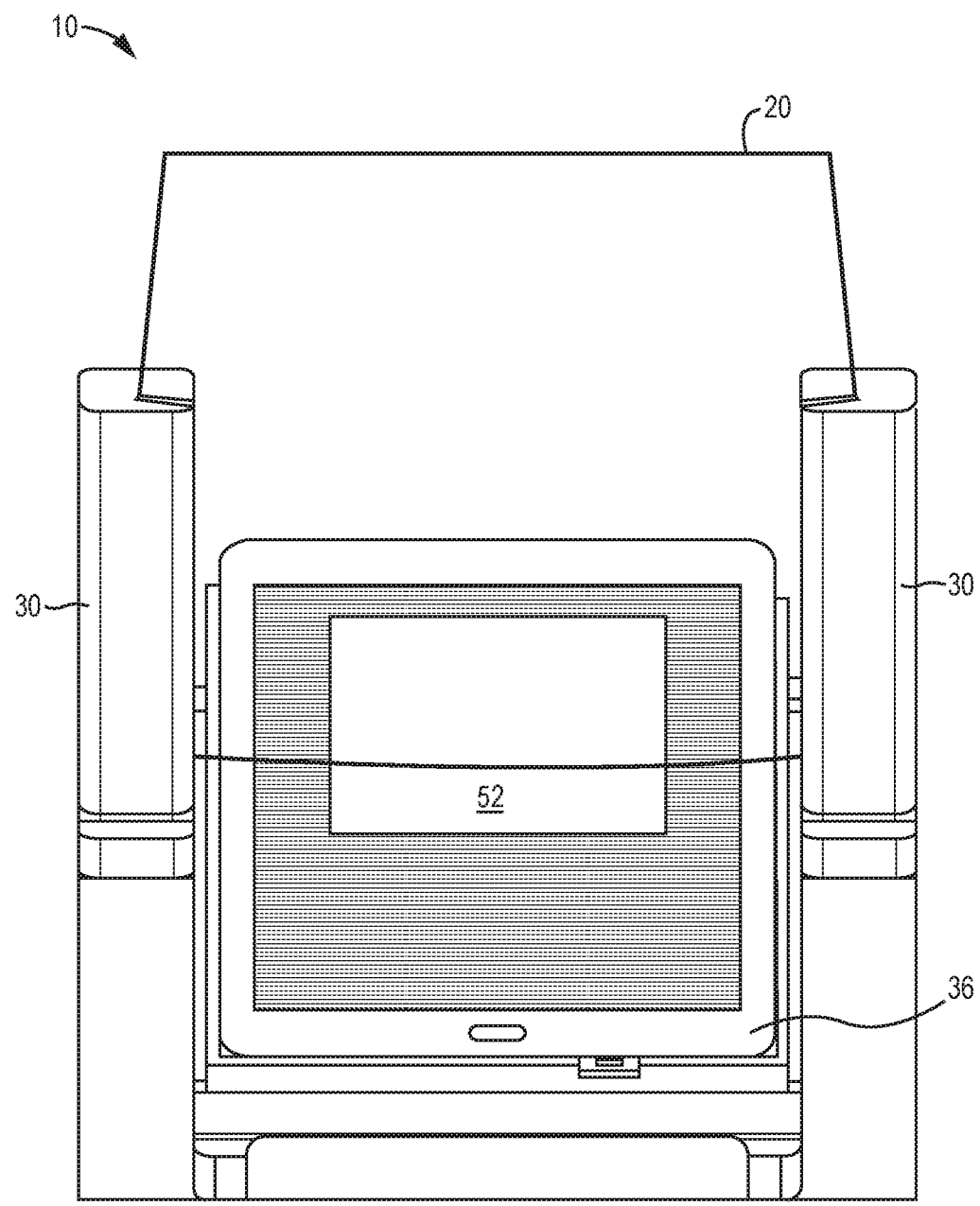
FIG. 5 is a front view of the HUD apparatus according to one embodiment.

FIG. 5 is a front view of the HUD apparatus 10 according to one embodiment.

Figure 6:
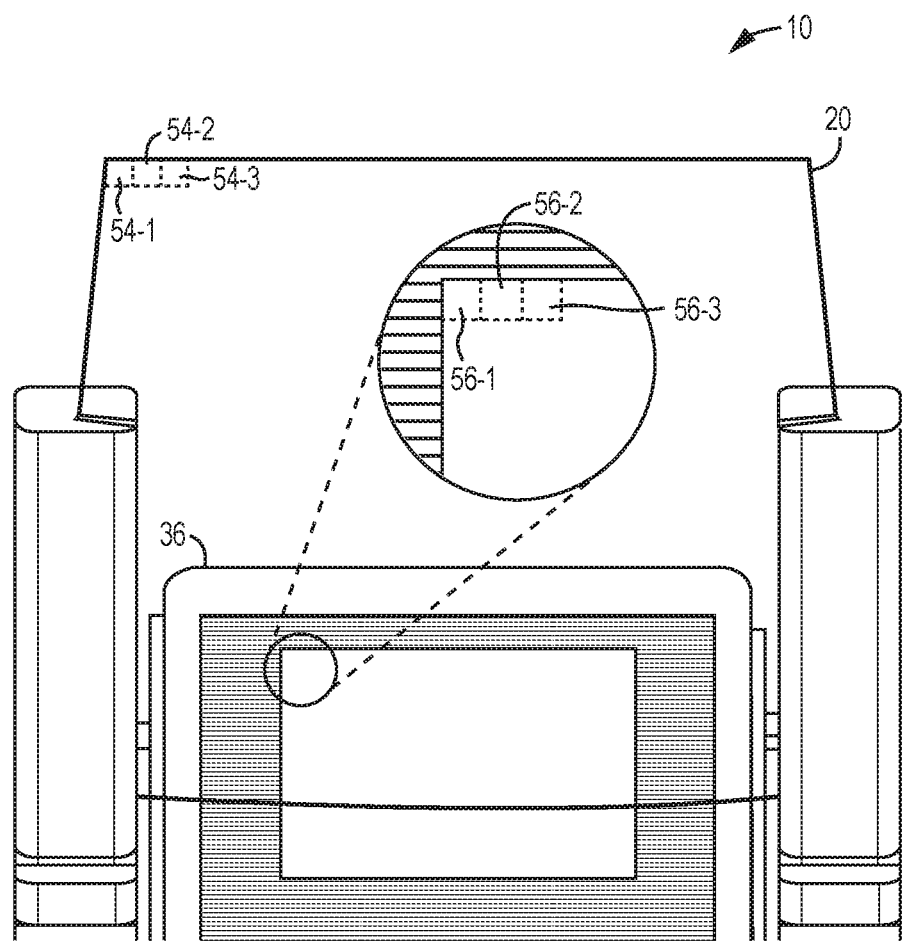
FIG. 6 is a front view of the HUD apparatus with an enlarged portion of a display for illustration of a correspondence between reflective surface areas on an interior surface (e.g., the surface facing a trainee or pilot) of a lens and display objects of a display.

FIG. 6 is a front view of the HUD apparatus 10 with an enlarged portion of the display 36 for illustration of a correspondence between reflective surface areas 54-1-54-3 (generally, surface areas 54) on the interior surface (e.g., the surface facing the trainee 14) of the lens 20 and display objects 56-1-56-3 (generally, display objects 56) of the display 36. In particular, the interior of the lens 20 comprises a plurality of reflective surface areas 54, each of which is mapped to a particular corresponding display object 56 of the display 36. For example, in this example the reflective surface areas 54-1-54-3 are mapped to the display objects 56-1-56-3, respectively.

While for purposes of illustration only three reflective surface areas 54 are illustrated, the entire interior surface of the lens 20 may comprise thousands of such reflective surface areas 54. The individual geometry of each reflective surface area 54, such as, for example, the radius of curvature of the reflective surface areas 54, may differ from the radius of curvature of adjacent reflective surface areas 54, or, may even differ from the radius of curvature of all other reflective surface areas 54 across the interior surface. The display objects 56 may comprise a single pixel of the display 36, or may comprise subsets of pixels of the display 36, such as, by way of non-limiting example, a 2×2, 4×4, or 8×8 matrix of pixels.

Each reflective surface area 54 is oriented based on a plurality of predetermined locations of the two eyes of a user within a predetermined volume, referred to herein as an eye box.

In embodiments where the lens 20 is used in a domed simulator, the reflective surface areas 54 are oriented to at least partially collimate the light from the display 36 device to focus the HUD imagery 22 on a spherical surface of a dome at a distance in front of the lens 20 for each eye of two eyes of a user.

In embodiments where the lens 20 is used in an aircraft, the reflective surface areas 54 are oriented to at least partially collimate the light from the display 36 device to focus the HUD imagery 22 at infinity for each eye of two eyes of a user.

Mechanisms for generating the reflective surface areas 54 of the lens 20 will now be discussed. U.S. Pat. No. 8,781,794 B2 (hereinafter "the '794 Patent"), is hereby incorporated herein by reference in its entirety. The mechanism for designing the lens 20 includes initially generating a grid of points that will be iteratively and algorithmically manipulated to define the interior surface of the lens 20. Each point in the grid of points has an X, Y and Z coordinate associated therewith.

Figure 7:
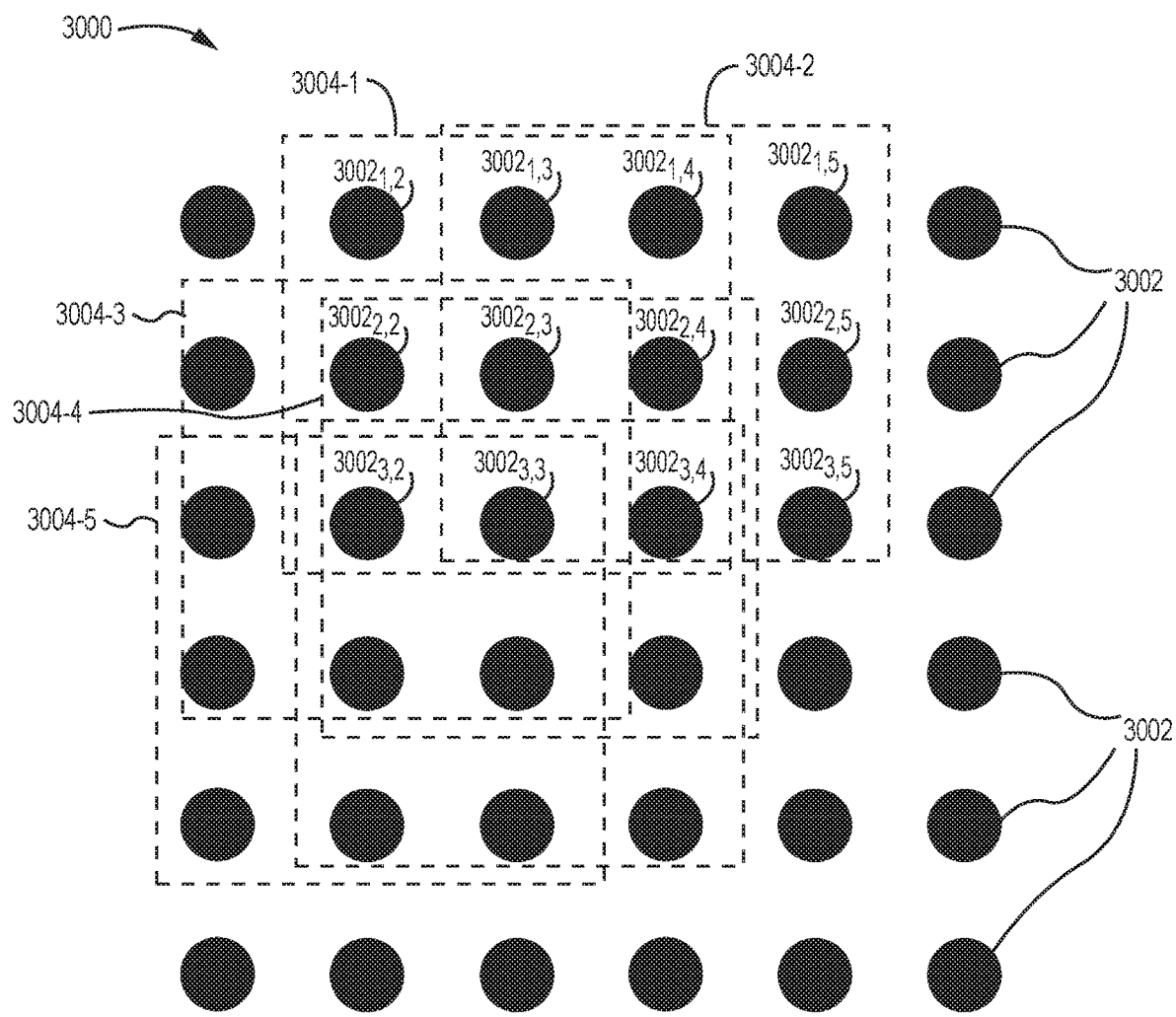
FIG. 7 illustrates a partial grid of points used to design the lens, according to one embodiment.

FIG. 7 illustrates a partial grid 3000 of points 3002 used to design the lens 20, according to one embodiment. Each point 3002 represents some surface area of the lens. Groupings of points 3002, referred to herein as oxels 3004, are treated as individual optical systems to determine X, Y, and Z coordinates for each point 3002 in an oxel 3004. In this example, each oxel 3004 includes nine points 3002, but the embodiments could utilize any number of points 3002 in an oxel 3004. The size of each oxel 3004 determines the amount of surface area represented by each point 3002. More oxels 3004 result in a greater number of calculations but more accuracy of the surface of the final lens 20. Fewer oxels 3004 result in a fewer number of calculations but less accuracy of the final lens 20.

As an example, an oxel 3004-1 is made up of the nine points $3002_{1,2}$, $3002_{1,3}$, $3002_{1,4}$, $3002_{2,2}$, $3002_{2,3}$, $3002_{2,4}$, $3002_{3,2}$, $3002_{3,3}$, $3002_{3,4}$. The center point, $3002_{2,3}$, is the primary point of the oxel 3004-1 that is used as a center of the oxel 3004-1 in the formulas below, but the entire oxel 3004-1 is treated as a single optical system, and thus the X, Y and Z coordinates of each point 3002 in the oxel 3004-1 are affected by the calculations below for the oxel 3004-1. An oxel 3004-2 is made up of the nine points $3002_{1,3}$, $3002_{1,4}$, $3002_{1,5}$, $3002_{2,3}$, $3002_{2,4}$, $3002_{2,5}$, $3002_{3,3}$, $3002_{3,4}$, $3002_{3,5}$. The center point, $3002_{2,4}$, is the primary point of the oxel 3004-2 that is used as a center of the oxel 3004-2 in the formulas below, but the entire oxel 3004-2 is treated as a single optical system, and thus the X, Y and Z coordinates of each point 3002 in the oxel 3004-2 are affected by the calculations below for the oxel 3004-2. The oxels 3004 overlap each other. Thus, except for certain points 3002 around the edge of the point cloud, each point 3002 may be associated with nine different oxels 3004, and each point 3002 is a center point 3002 for one of those nine different oxels 3004 during a particular calculation below. The collection of points 3002 in an oxel 3004 serves to represent the curvature of the oxel 3004 in the calculations below.

Each oxel 3004 is associated with a particular display object 56 of the display 36. In some embodiments, the number of oxels 3004 is set to be equal to the number of display objects 56. A display object 56 can comprise, for example, a single pixel of the display 36, or a group of pixels of the display 36. In some embodiments the display objects 56 do not overlap one another, and each display object 56 typically corresponds to one particular oxel 3004.

The geometry of an oxel 3004, and therefore the exact location of the points 3002 that make up the oxel 3004 are determined based on a perfect (or ideal) optical system for reflecting the light from a corresponding display object 56 toward a particular eye location to cause the light to be focused at a desired distance in front of the lens 20, such as on a spherical surface of a dome.

Thus, if each oxel 3004 were the only optical system in the design of the lens 20, the points 3002 associated with the oxel 3004 would exactly lie on a calculated surface based on the formulas below to cause the light from the corresponding display object 56 to be reflected towards a particular eye location to cause the light to be focused at the desired distance in front of the lens 20.

However, the nine points 3002 that perfectly define one oxel 3004 will not be in the precise location that would perfectly define the closest overlapping oxel 3004. For example, the precise location of the point $3002_{2,3}$, when used to determine the perfect geometry for the oxel 3004-1, will be at a first particular X, Y and Z location. However, when the perfect geometry of the oxel 3004-2 is determined in accordance with the formulas below, the precise location of the point $3002_{2,3}$ for the oxel 3004-2 may be at a second X, Y and Z location that differs from the first particular X, Y and Z location. The difference between the ideal location of a point 3002 and the actual location of the point 3002 for each oxel 3004 is quantified in an error value. The oxels 3004 are iteratively analyzed (iterations across the point cloud of points 3002 may be referred to herein as epochs and/or adaptations) in accordance with the formulas below to reduce the sum of the error values across the point cloud. Each epoch involves analyzing all the oxels 3004 in the point cloud, determining the corresponding three-dimensional errors for each point 3002 based on a current X, Y and Z location of the point 3002 for each oxel 3004 with which the point 3002 is associated and each ideal location of the point 3002 for each oxel 3004 with which the point 3002 is associated, and moving each point 3002 to lower the summed three-dimensional error. As will be discussed below, the iterations are also performed using variables for each iteration. In these examples, the variables include two different eyes, as well as different locations of each eye within the eye box. In the case of a non-planar surface, such as a domed interior, the variables also include different focal distances, since different portions of the HUD imagery are focused on different portions of a non-planar surface.

After thousands, or millions of iterations, the average error across the point cloud stops dropping, and the process is finished. The result is a point cloud of the points 3002 at X, Y and Z locations that collectively define a three-dimensional surface. Each point 3002 has a unique X, Y and Z location that defines the interior surface of the lens 20. A smoothing algorithm, such as a non-uniform rational basis spline (NURBS) algorithm, is then applied to the points 3002 to create a smooth surface. This final point cloud then defines exactly the interior surface of the lens 20.

In the '794 Patent, the location of a rolling center of the eye is positioned at X=0, Y=0, and Z=0 in the derivation of the surface of the lens designed in the '794 Patent. In the present embodiments, the derivation of the surface of the lens 20 is based on both the left and the right eye positions of a user, with the center-point between both eyes being the X=0, Y=0, and Z=0 position. The embodiments utilize repeated adaptation cycles/iterations/epochs, such as millions of adaptation cycles, in which all the oxels 3004 are processed in accordance with the formulas below, and the locations of the points 3002 are calculated and adapted over the entire lens 20. In order to take into account both the left and right eyes of the user, some of the adaptations are performed with the 'eye' center in the calculation moved to coincide with the left eye and some of the calculations are performed with the 'eye' center in the calculation moved to coincide with the right eye.

In the HUD apparatus 10, the eyes of the trainee 14 may be 30 or more inches from the lens 20, and, because the lens 20 is not coupled to the head of the trainee 14, in contrast to a head-mounted display, the eyes of the trainee 14 may be in any of a range of locations with respect to the lens 20 during the simulation. To accommodate the movement of the head of a user, an eye-box volume is calculated and used during the design of the lens 20. The eye-box volume represents a volume in which the eyes of a user may be located over a duration of a simulation.

Figure 8:
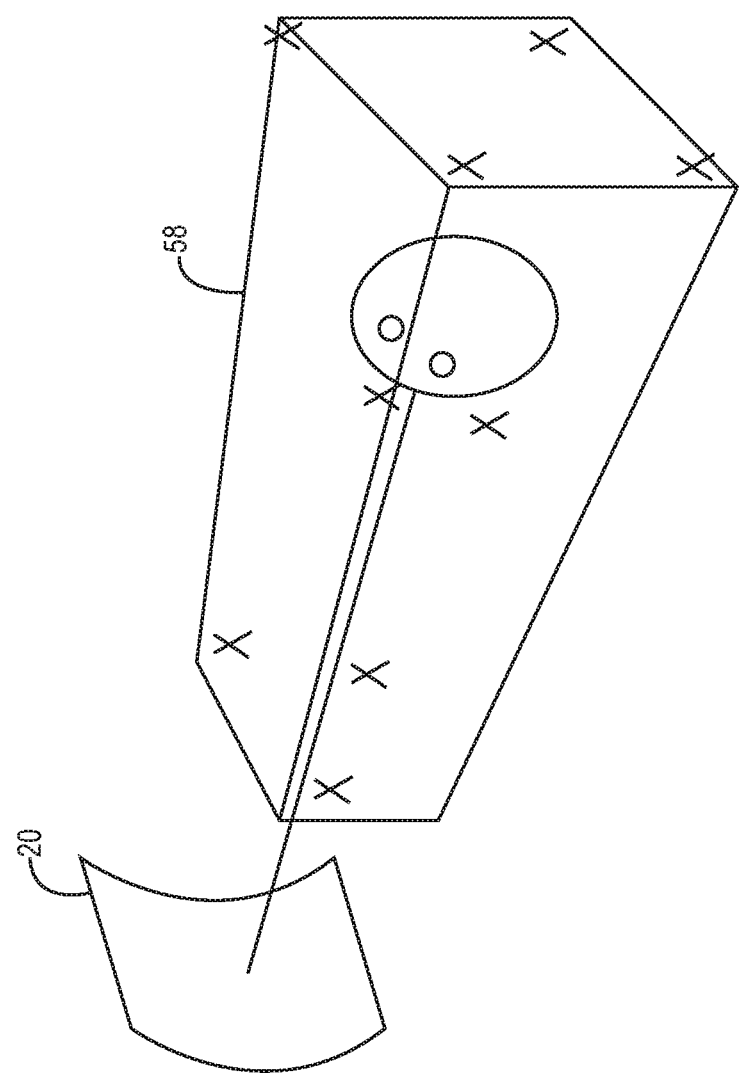
FIG. 8 is a diagram illustrating the use of an eye-box volume in the design of the lens, according to one embodiment.
Figure 8:
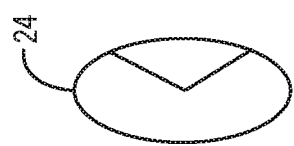

In this regard, FIG. 8 is a diagram illustrating the use of an eye-box volume 58 in the design of the lens 20 according to one embodiment. The "X"s denoted in the eye-box volume 58 represent predetermined locations of center-points between both eyes of a user. These locations may be referred to as "eye points." Each such predetermined location may be used in the iterations performed on the points 3002 of the point cloud. Separate locations of the right eye and the left eye for each of these eye point locations are calculated with respect to the location of the center of a line connecting the rolling centers of the left and right eyes. Each of these two positions (one for each eye) is utilized sequentially in the surface adaptation equations below. For some locations, such as those at the extremes of the eye-box volume 58, more iterations may occur for one eye than the other eye. In the design eye point, where the trainee's head is expected to be, more iterations are performed in that area for both eyes. In a cyclic manner all the eye points are calculated and the oxels 3004 are adapted, with some eye points receiving more adaptation cycles, and then the cycle repeats.

Equations used to define the geometry of oxels 3004 are discussed below.

Figure 9:
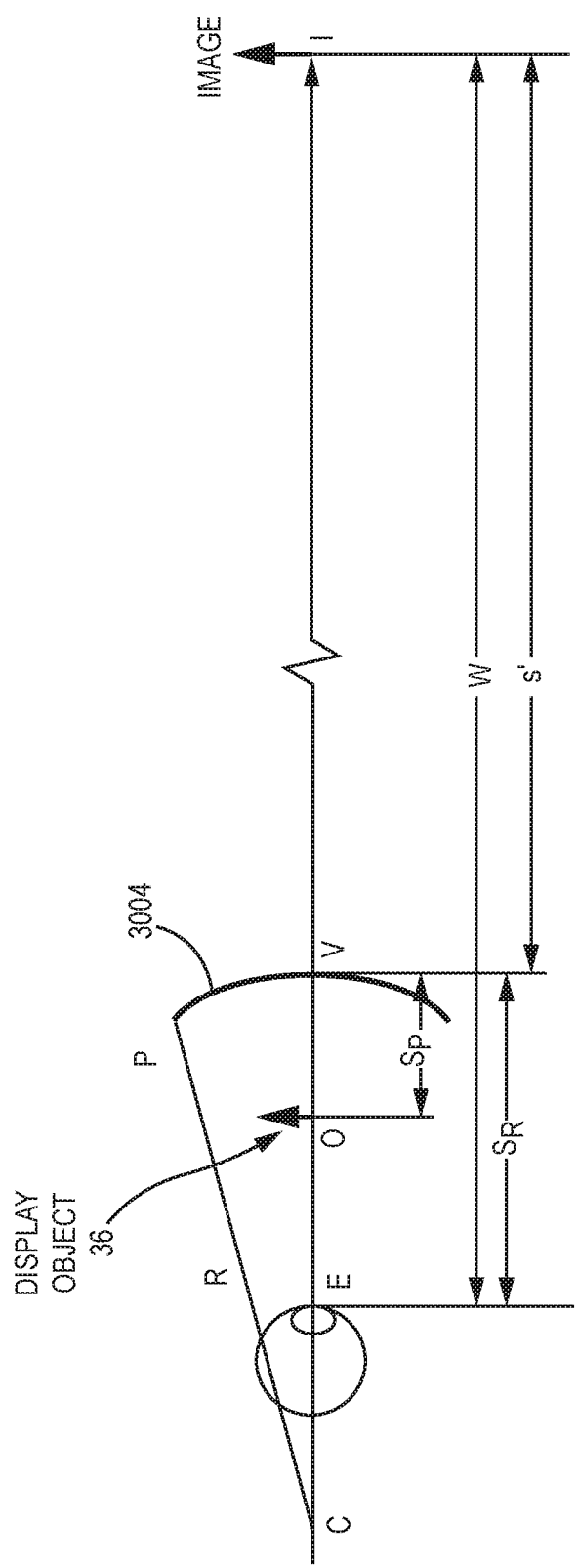
FIG. 9 is a schematic diagram illustrating parameters used to calculate the geometry of an oxel, according to one embodiment.

FIG. 9 is a schematic diagram illustrating parameters used to calculate the geometry of an oxel 3004, according to one embodiment.

The parameters include:

P=diopter power [D] of the oxel 3004;

W=desired distance in meters to the virtual image (e.g., virtual imagery 24) in meters;

R=radius in meters to the oxel 3004 from the oxel radius of curvature center point, C;

$s_P$=distance in meters to the corresponding display object 56 ("O") from vertex V of the oxel 3004;

$s_R$=distance from reflection to eye point in meters;

s'=distance to image I, which in this case is a virtual image and s' represents the distance in meters to the desired focal point from the surface of the oxel 3004.

The particular locations of the display objects 56 may be identified, for example, in a table or other data structure, or a reference point of the display 36 may be identified, such as a bottom right corner of the display 36 may be identified, and the locations of the individual display objects 56 may be calculated based on the known location of the reference point.

In accordance with the book: "Introduction to Optics, $2^{nd}$ Ed." By F. L. Pedrotti, S. J. and L. S. Pedrotti, Prentice Hall, N J, 1993 (hereinafter, "Pedrotti"), the following equation represents the optical system:

$$\frac{1}{s_P} + \frac{1}{s'} = -\frac{2}{R} \qquad 1$$

In this system, for the correct optics the sign conventions from Pedrotti are:
1) Because the display object O is to the left of the vertex V then the object is real and $s_p$ is positive;
2) Because the image I is to the right of the vertex V, the image is virtual and s' is negative;
3) Since the reflective element is concave, thus the center of curvature C is to the left of the vertex V, and R is negative.

From FIG. 8, and sign convention 2, it can be seen that $$s' = -(|W| - |s_R|) \qquad 2$$

Solving for R, and substituting in for s' yields $$R = \frac{-2}{\frac{1}{|s_P|} + \frac{1}{|s_R| - |W|}} \qquad 3$$

This solution for R also uses the absolute value of $s_p$, referencing sign convention 1. Refactoring the solution for R yields:

$$R = \frac{2|s_P|(|s_R| - |W|)}{|W| - |s_P| - |s_R|} \qquad 4$$

This equation is used for the varying distances to the left or right eye of the user, with the variable $s_R$ taking on the appropriate distance to the corresponding eye from the center of the respective oxel 3004. Also, the direction to which the oxel 3004 points is controlled by the location to which the eye being adapted is in this particular iteration.

Note that the direction to which an oxel 3004 points is governed by where the display object 56 is and the particular location of the eye.

Figure 10:
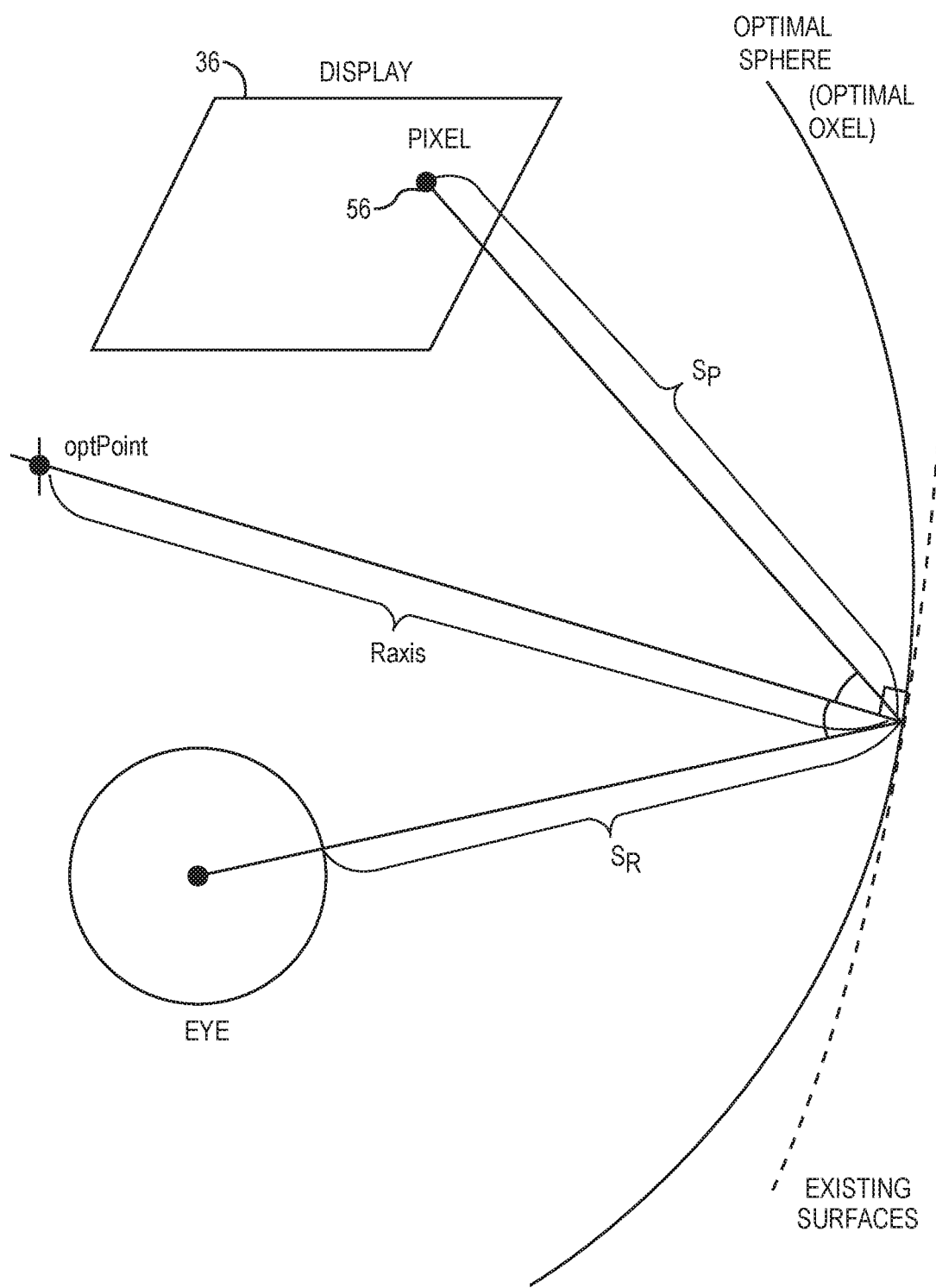
FIG. 10 is a schematic diagram illustrating the determination, for each iteration, of a direction in which an oxel is to point, according to one embodiment.

FIG. 10 is a schematic diagram illustrating the determination, for each iteration, of the direction in which an oxel 3004 is to point. In particular, the direction is governed by the location of the display object 56 to which this oxel 3004 corresponds, the location of the particular eye, and the 3-dimensional angle between these locations. This changes for each eye point location and each display object 56.

When the lens 20 is used in a domed simulator such as the domed simulator 12 (FIG. 1), the virtual imagery 24 is focused on a non-planar interior surface, in particular, the spherical or elliptical surface of the dome 18. Because the distance from the eyes of the trainee 14 to different portions of the dome 18 differs, the embodiments take into consideration the non-planar interior surface of the dome 18 in the design of the lens 20.

Figure 11:
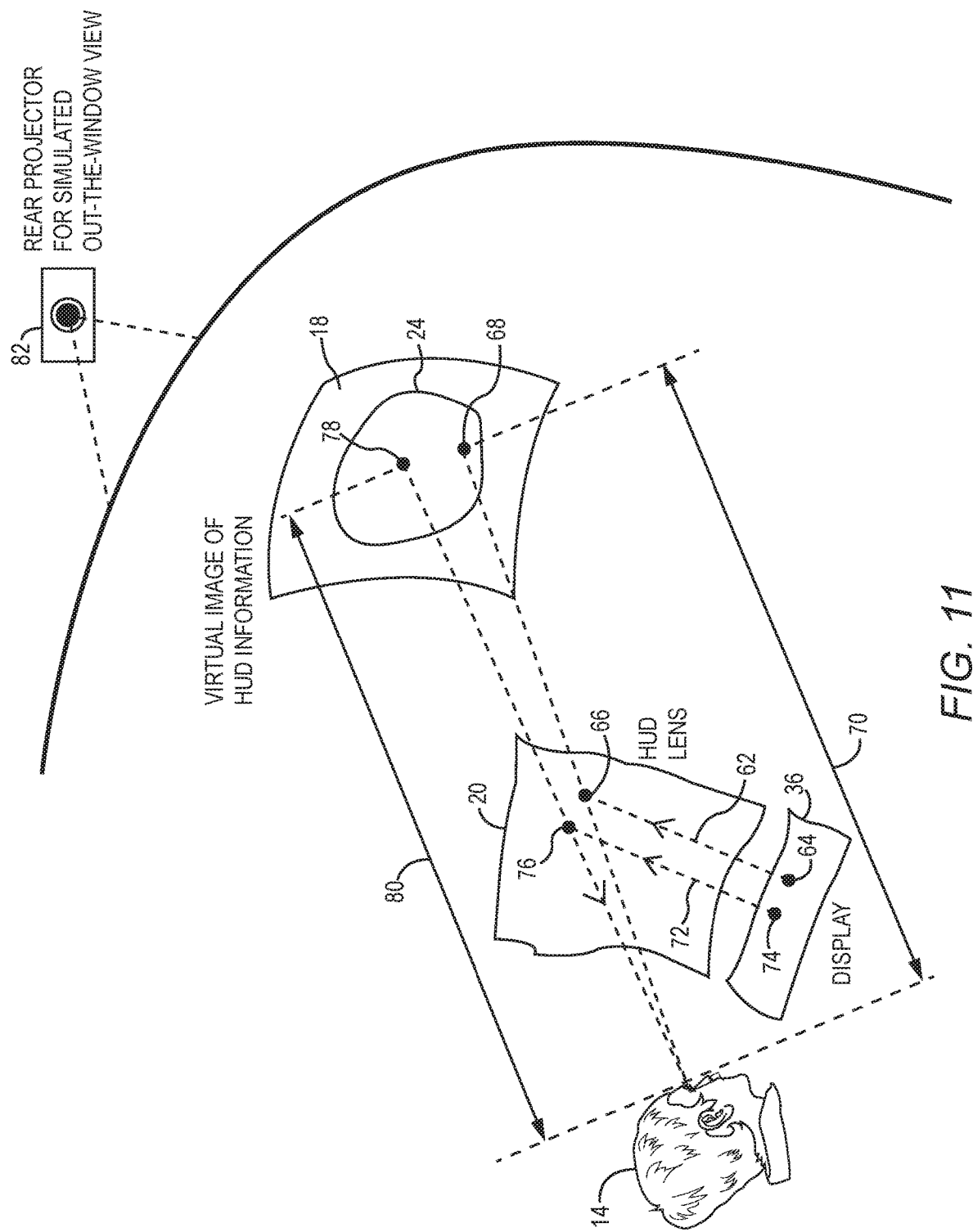
FIG. 11 is a schematic diagram illustrating the different distances between virtual imagery and the eyes of a trainee, according to one embodiment.

FIG. 11 is a schematic diagram illustrating the different distances between the virtual imagery 24 and the eyes of the trainee 14, according to one embodiment. Light 62 is generated by a display object 64 on the display 36, and is reflected from point 66 on the lens 20 toward the eyes of the trainee 14, and is also collimated by the lens 20 to appear at the dome 18 at point 68 (which is on the interior surface of the dome 18). The point 68 is a distance 70 from the eyes of the trainee 14. Similarly light 72 emitted from a display object 74 on the display 36 is reflected into the eyes of the trainee 14 from a point 76 on the lens 20, and the trainee 14 sees the light 72 at a point 78 on the dome 18, at a distance 80 from the eyes of the trainee 14. In this example, the distances 70 and 80 are different from one another, and if the distances 70 and 80 are not taken into account during the generation of the lens 20, the virtual imagery 24 will be focused at points inside, on and outside the dome 18, while the OTW imagery 16 displayed on the dome 18 by a projector 82 is focused on the dome 18. This would lead to unnatural focusing by the trainee 14 and causes, among other issues, eyestrain.

To take into consideration the different distances 70 and 80, the distance W in Equation 4, above, is changed for each oxel 3004 and for each different eye point to be the actual distance from the eye, in that iteration, to the appropriate point on the interior surface of the dome 18. A table, or equation, is determined that defines W for each oxel 3004 across the surface of the mathematical representation of the lens 20 based on the location of the eye point as the eye locations are moved to accommodate the two-eye solution and the eye-box volume 58.

Figure 12:
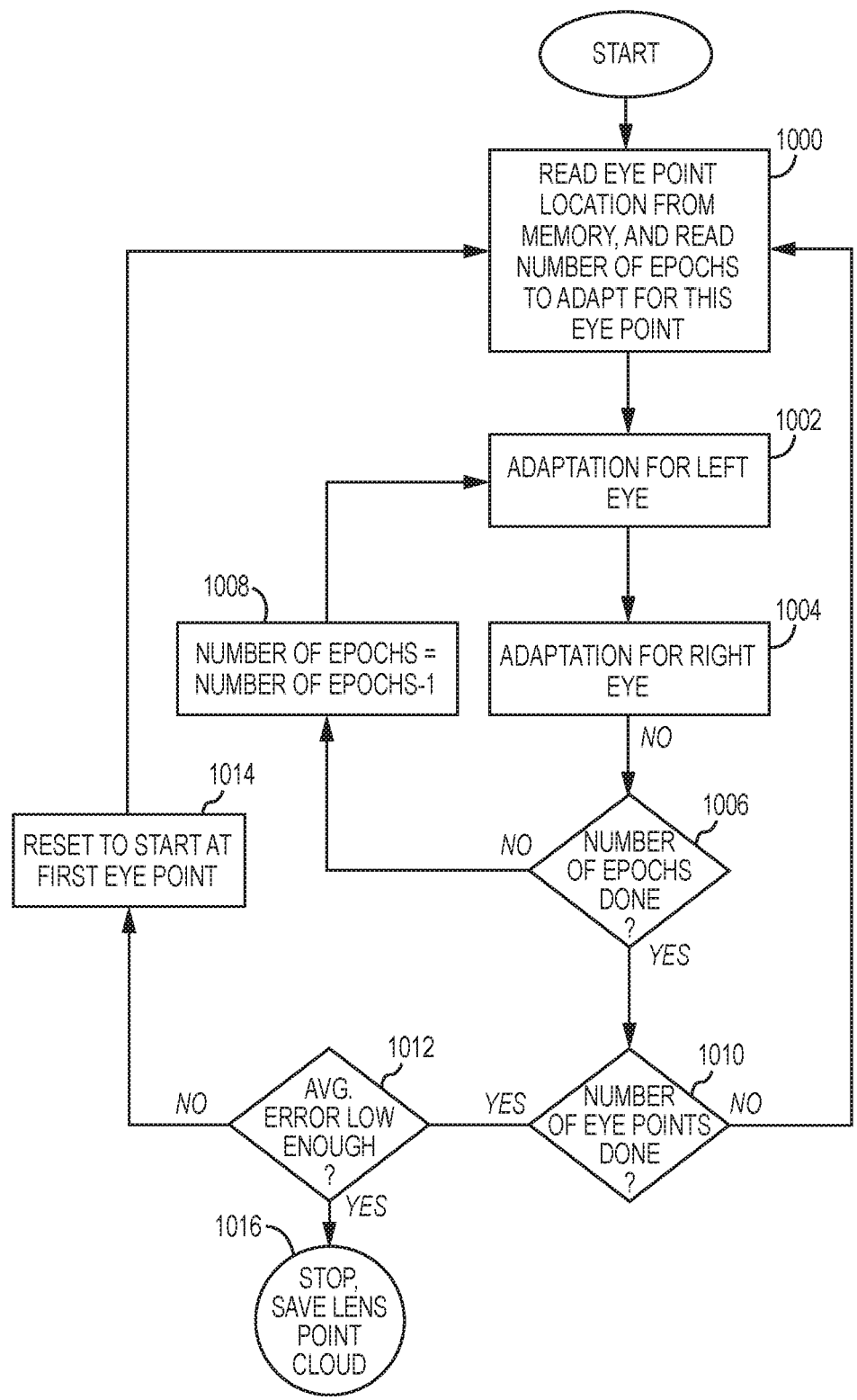
FIG. 12 is a flowchart of a method of generating the point cloud of points using a plurality of different eye points according to one embodiment.

FIG. 12 is a flowchart of a method of generating a point cloud of points 3002 using a plurality of different eye point locations according to one embodiment. As will be discussed below, the process may be implemented by a processor device of a computing device that is programmed with software instructions to perform the calculations described herein. In this example, a table is created that identifies the various eye point locations X, and a number of epochs that will be performed on the point cloud for each eye point location before processing the next eye point location. The eye point locations are iteratively processed repetitively until the error criterion is reached. The processor device begins by reading from the table the first eye point location, and the number of epochs for this eye point location (block 1000). The processor device then accesses each oxel 3004 in the point cloud and manipulates the X, Y and Z locations of the points 3002 that make up the oxel 3004 based on the formulas discussed above, as well as this particular eye location for the left eye (block 1002). The particular location of the left eye may be at some predetermined offset from the eye point location, such as −30 millimeters (mm). The processor device then accesses each oxel 3004 in the point cloud and manipulates the X, Y and Z locations of the points 3002 based on the formulas discussed above, as well as the particular eye location for the right eye (block 1004). Again, the particular location of the right eye may be at some predetermined offset from the eye point location, such as +30 mm.

The processor device then determines if additional epochs, i.e., iterations of the points 3002 in the point cloud, are to be done (block 1006). If so, then the processor device decrements the number of epochs, and repeats the process for the left eye and the right eye (blocks 1008, 1002, 1004, 1006). This continues until the number of epochs has been performed.

The processor device then determines if additional eye point locations need to be processed from the list of eye point locations (block 1010). If so, the processor device reads a new eye point from the list of eye point locations and processes it for the specified number of left and right eye epochs.

As an example, assume an eye point list such as the following:

| Number_of_epochs, | Eyepoint_X, | Eyepoint_Y, | Eyepoint_Z |
|---|---|---|---|
| 60, | 12.2, | 23.3, | 23.5 |
| 4, | 34.3, | −32.2, | 3.3 |
| 1, | 2.56, | −45.0, | 33.2 |

This eye point location list has three eye point locations: that represented by the first line, that represented by the second line, and the third eye point location represented by the third line. The processor device starts at block 1000 and reads the first line from the eyepoint list "60, 12.2, 23.3, 23.5" which tells the processor device to process the cyclopean eye location x=12.2, y=23.3, and z=23.5, and to work this eye point location 60 times through a left eye offset epoch (block 1002) and a right eye offset epoch (block 1004), 120 epochs (60 per eye) in total. Then, the processor device obtains the next eye point location "4, 34.3, −32.2, 3.3" and processes this eye point location four times through, and this goes on until there are no more eye point locations remaining in the list.

At block 1012, the processor device determines if the average error across the point cloud has stopped decreasing or has begun increasing. If so, then the process stops (block 1016). If not, the process is reset to start reprocessing the eye point location list from the first entry (block 1014).

Note that the eye point location processing is balanced out in an iterative fashion to slowly adapt the points 3002 to satisfy the focusing requirements from all eye point locations by iterating rapidly on a list of the eye point locations for only a few epochs each, and repeating this cyclically until the error criterion is reached.

Figure 13:
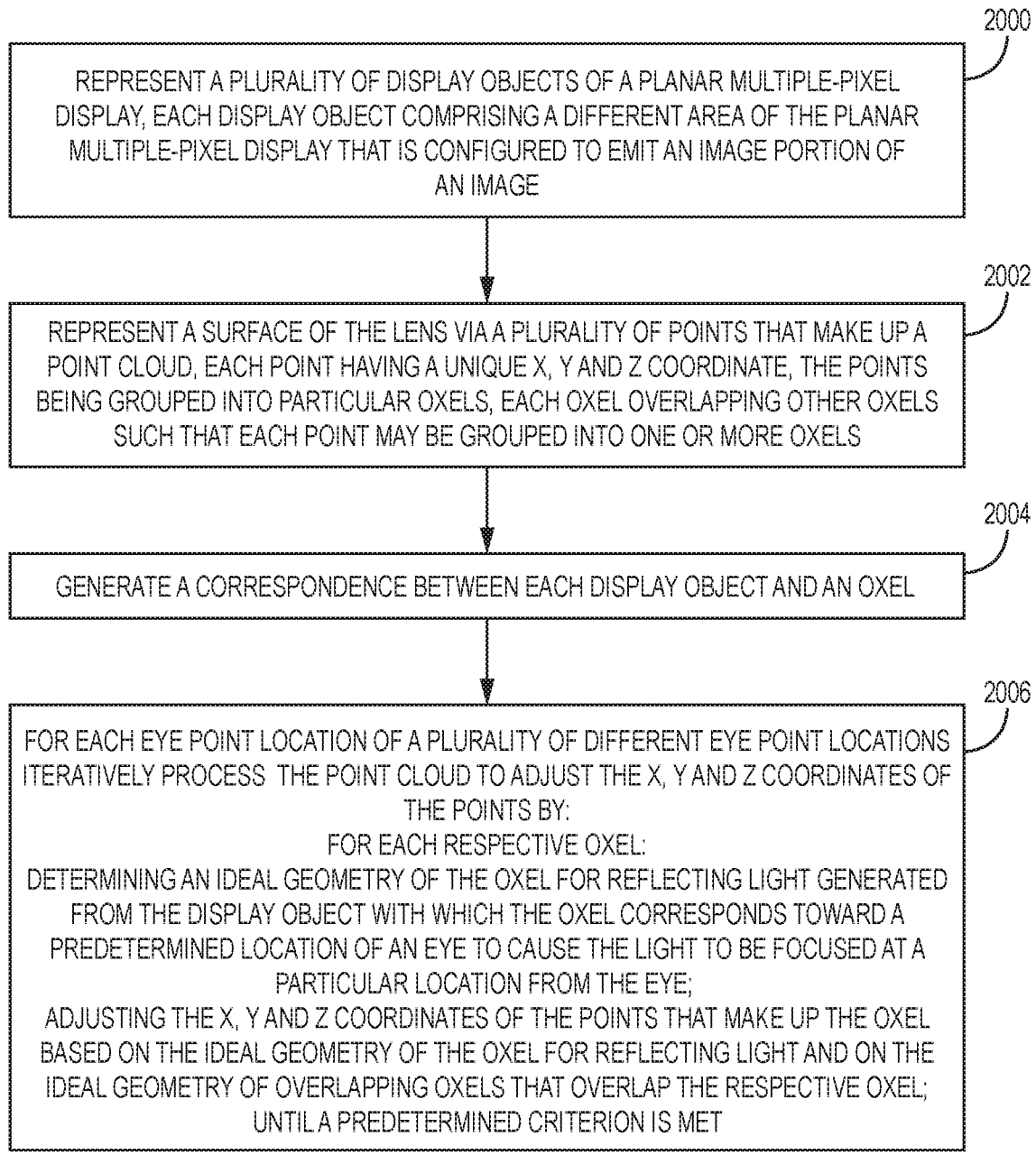
FIG. 13 is a flowchart of a method for generating the lens according to one embodiment.

FIG. 13 is a flowchart of a method for generating the lens 20 according to one embodiment. The plurality of display objects 56 of the planar multiple-pixel display 36 is represented. Each display object 56 is a different area of the planar multiple-pixel display 36 that is configured to emit an image portion of the HUD imagery (block 2000). The surface of the lens 20 is represented via a plurality of points 3002 that make up a point cloud, with each point 3002 having a unique X, Y and Z coordinate. The points 3002 are grouped into particular oxels 3004, wherein each oxel 3004 overlaps other oxels 3004 such that each point 3002 may be grouped into one or more oxels 3004 (block 2002).

A correspondence is generated between each display object 56 and a particular oxel 3004 (block 2004). For each eye point location of a plurality of different eye point locations, the point cloud is iteratively processed to adjust the X, Y and Z coordinates of the points 3002 by, for each respective oxel 3004, determining an ideal geometry of the respective oxel 3004 for reflecting light generated from the display object 56 with which the respective oxel 3004 corresponds toward a predetermined location of an eye to cause the light to be focused at a particular location in the eye. The X, Y and Z locations of the points 3002 that make up the oxel 3004 are adjusted based on the ideal geometry of the oxel 3004 for reflecting light and on the ideal geometry of overlapping oxels 3004 that overlap the respective oxel 3004. This process is repeated until a predetermined criterion is met.

The output of the process illustrated in FIG. 13 is a point cloud of points 3002 that collectively identify the internal surface, in terms of a plurality of reflective surface areas 54 that correspond to the points 3002, each with its own unique spatial location. The point cloud may be input, for example, into a three-dimensional (3D) additive manufacturing machine to generate the lens 20, or into a CAD (computer aided design) software package that will transform the point cloud into a smooth surface representation, such as in a STEP file representation. The lens 20 may comprise, for example, polycarbonate, glass, or other transparent material.

In some embodiments, after the process discussed above with regard to FIG. 13, the point cloud of points 3002 may be smoothed prior to production. In particular, in some embodiments, an algorithm or function, such as a non-uniform rational basis spline (NURBS) algorithm, may be applied to the point cloud to smooth the points 3002 and form a smoothed representation of the point cloud, which comprises mathematical curve representations in place of the points 3002, to help achieve specularity (i.e., a smooth reflectiveness), instead of rough points.

In some embodiments, iteratively processing the point cloud to adjust the X, Y and Z coordinates of the points 3002 includes iteratively adjusting the X, Y and Z coordinates of the points 3002 based on a location of a first eye; and iteratively adjusting the X, Y and Z coordinates of the points 3002 based on a location of a second eye that is at a different location than the first eye.

In some embodiments, the predetermined criterion that the error function satisfies involves adjusting the spatial locations of the points 3002 until an average error calculated for all the points 3002 after each iteration stops decreasing or begins increasing.

Figure 14:
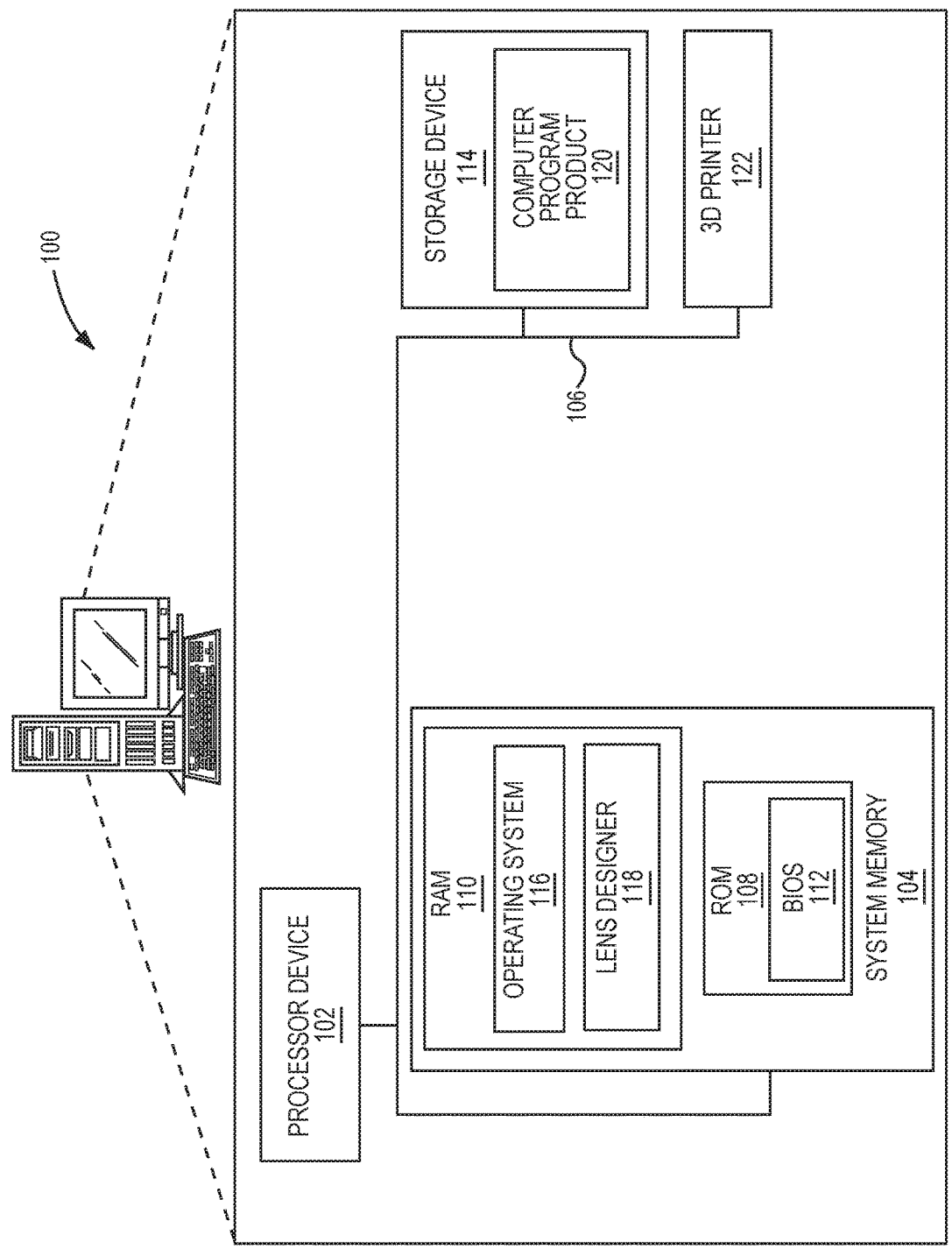
FIG. 14 is a block diagram of a computing device suitable for generating the lens according to one example.

FIG. 14 is a block diagram of a computing device 100 suitable for generating the lens 20 according to one example. The computing device 100 may comprise any one or more computing or electronic devices capable of including firmware, hardware, and/or executing software instructions to implement the functionality described herein, such as a computer server, a desktop computing device, a laptop computing device, a virtual machine executing on a server computing device, or the like. The computing device 100 includes a processor device 102, a system memory 104, and a system bus 106. The system bus 106 provides an interface for system components including, but not limited to, the system memory 104 and the processor device 102. The processor device 102 can be any commercially available or proprietary processor.

The system bus 106 may be any of several types of bus structures that may further interconnect to a memory bus (with or without a memory controller), a peripheral bus, and/or a local bus using any of a variety of commercially available bus architectures. The system memory 104 may include non-volatile memory 108 (e.g., read-only memory (ROM), erasable programmable read-only memory (EPROM), electrically erasable programmable read-only memory (EEPROM), etc.), and volatile memory 110 (e.g., random-access memory (RAM)). A basic input/output system (BIOS) 112 may be stored in the non-volatile memory 108 and can include the basic routines that help to transfer information between elements within the computing device 100. The volatile memory 110 may also include a high-speed RAM, such as static RAM, for caching data.

The computing device 100 may further include or be coupled to a non-transitory computer-readable storage medium such as a storage device 114, which may comprise, for example, an internal or external hard disk drive (HDD) (e.g., enhanced integrated drive electronics (EIDE) or serial advanced technology attachment (SATA)), HDD (e.g., EIDE or SATA) for storage, flash memory, or the like. The storage device 114 and other drives associated with computer-readable media and computer-usable media may provide non-volatile storage of data, data structures, computer-executable instructions, and the like. Although the description of computer-readable media above refers to an HDD, it should be appreciated that other types of media that are readable by a computer, such as Zip disks, magnetic cassettes, flash memory cards, cartridges, and the like, may also be used in the operating environment, and, further, that any such media may contain computer-executable instructions for performing novel methods of the disclosed examples.

A number of modules can be stored in the storage device 114 and in the volatile memory 110, including an operating system 116 and one or more program modules, such as a lens designer 118, which may implement the functionality described herein in whole or in part.

All or a portion of the examples may be implemented as a computer program product 120 stored on a transitory or non-transitory computer-usable or computer-readable storage medium, such as the storage device 114, which includes complex programming instructions, such as complex computer-readable program code, to cause the processor device 102 to carry out the steps described herein. Thus, the computer-readable program code can comprise software instructions for implementing the functionality of the examples described herein when executed on the processor device 102. The processor device 102, in conjunction with the lens designer 118 in the volatile memory 110, may serve as a controller, or control system, for the computing device 100 that is to implement the functionality described herein.

The computing device 100 may also include, or be coupled to, a 3D printer 122 that is configured to input a point cloud generated by the lens designer 118 that defines the interior surface of the lens 20, and generate the lens 20. In some embodiments, the point cloud is used to generate a mold which may then be used in an injection molding process to generate the lens 20.

Those skilled in the art will recognize improvements and modifications to the preferred embodiments of the disclosure. All such improvements and modifications are considered within the scope of the concepts disclosed herein and the claims that follow.

What is claimed is:

1. A head-up display apparatus comprising:
a display holder configured to hold a single planar multiple-pixel display; and
a single reflective and transmissive lens configured to reflect an image from the planar multiple-pixel display toward a predetermined location of a user, the reflective and transmissive lens further configured to at least partially collimate light from the planar multiple-pixel display to focus the image at a location beyond the reflective and transmissive lens for each eye of two eyes of the user, the location beyond the reflective and transmissive lens being at a greater distance than a distance of the reflective and transmissive lens to an eye of the user, wherein the reflective and transmissive lens comprises a plurality of reflective surface areas mapped to corresponding display objects of the planar multiple-pixel display, each reflective surface area oriented based on a plurality of predetermined locations of the two eyes of the user within a predetermined volume, wherein the plurality of reflective surface areas collectively forms a single continuous lens surface.

2. The head-up display apparatus of claim 1 wherein the plurality of reflective surface areas are oriented to at least partially collimate the light from the planar multiple-pixel display to focus the image on a spherical surface at the location beyond the reflective and transmissive lens for each eye of the two eyes of the user.

3. The head-up display apparatus of claim 1 wherein the plurality of reflective surface areas is further configured to at least partially collimate the light from the planar multiple-pixel display to focus the image at infinity.

4. The head-up display apparatus of claim 1 wherein each reflective surface area of the plurality of reflective surface areas has a corresponding radius of curvature that is different from a radius of curvature of each other reflective surface area.

5. The head-up display apparatus of claim 1 further comprising an adjustable bracket coupled to the display holder, the adjustable bracket configured to allow adjustment of the planar multiple-pixel display with respect to the reflective and transmissive lens and to alter the location where the image is focused.

6. The head-up display apparatus of claim 5 wherein the adjustable bracket is configured to allow the planar multiple-pixel display to be moved closer or farther from the reflective and transmissive lens, and to allow a plane in which the planar multiple-pixel display lies to be varied with respect to the reflective and transmissive lens.

7. The head-up display apparatus of claim 5 wherein the reflective and transmissive lens comprises an anti-reflective coating on an exterior surface of the reflective and transmissive lens, the exterior surface of the reflective and transmissive lens being configured to face a dome of a domed simulator.

8. A domed simulator comprising:
a dome;
a simulated cockpit; and
a head-up display apparatus coupled to the simulated cockpit, comprising:
a display holder configured to hold a single planar multiple-pixel display; and
a single reflective and transmissive lens configured to reflect an image from the planar multiple-pixel display toward a predetermined location of a user, the reflective and transmissive lens further configured to at least partially collimate light from the planar multiple-pixel display to focus the image on the dome, wherein the reflective and transmissive lens comprises a plurality of reflective surface areas mapped to corresponding display objects of the planar multiple-pixel display, each reflective surface area oriented based on a plurality of predetermined locations of two eyes of the user within a predetermined volume, wherein the plurality of reflective surface areas collectively forms a single continuous lens surface.

9. An airplane comprising:
a cockpit; and
a head-up display apparatus coupled to the cockpit comprising:
- a display holder configured to hold a single planar multiple-pixel display; and
- a single reflective and transmissive lens configured to reflect an image from the planar multiple-pixel display toward a predetermined location of a user, the reflective and transmissive lens further configured to at least partially collimate light from the planar multiple-pixel display to focus the image at infinity, wherein the reflective and transmissive lens comprises a plurality of reflective surface areas mapped to corresponding display objects of the planar multiple-pixel display, each reflective surface area oriented based on a plurality of predetermined locations of two eyes of the user within a predetermined volume, wherein the plurality of reflective surface areas collectively forms a single continuous lens surface.

10. A head-up display apparatus comprising:
- a display holder configured to hold a single planar multiple-pixel display; and
- a single reflective and transmissive lens configured to reflect an image from the planar multiple-pixel display toward a predetermined location of a user, the reflective and transmissive lens further configured to at least partially collimate light from the planar multiple-pixel display to focus the image at a location beyond the reflective and transmissive lens for each eye of two eyes of the user, the location beyond the reflective and transmissive lens being at a greater distance than a distance of the reflective and transmissive lens to an eye of the user; and
- an adjustable bracket coupled to the display holder, the adjustable bracket configured to allow adjustment of the planar multiple-pixel display with respect to the reflective and transmissive lens and to alter the location where the image is focused.

* * * * *